United States Patent [19]

Turcotte

[11] 4,338,362

[45] Jul. 6, 1982

[54] METHOD TO SYNTHESIZE AND PRODUCE THIN FILMS BY SPRAY PYROLYSIS

[75] Inventor: Richard L. Turcotte, Malden, Mass.

[73] Assignee: Radiation Monitoring Devices, Inc., Watertown, Mass.

[21] Appl. No.: 231,138

[22] Filed: Feb. 3, 1981

[51] Int. Cl.³ .................. B05D 1/02; B05D 3/02; C03C 17/10; C03C 17/22

[52] U.S. Cl. .................. 427/314; 427/74; 427/76; 427/160

[58] Field of Search .................. 427/74, 160, 314, 76

[56] References Cited

U.S. PATENT DOCUMENTS 3,148,084 9/1964 Hill et al. .

OTHER PUBLICATIONS

Chamberlin, R. R. and Skarman, J. S., "Chemical Spray Deposition for Inorganic Films", *J. Electrochemical Soc.*, vol. 113, No. 1, Jan. 1966, pp. 86–89.

Feigelson, R. S., et al. "II–IV Solid–Solution Films by Spray Pyrolysis", *J. App. Phy.*, vol. 48, No. 7, Jul. 1977, pp. 3162–3164.

Aranovich, J., et al., "Optical and Electrical Properties of ZnO Films Prepared by Spray Pyrolysis for Solar Cell Applications", *J. Vac. Sci. Technol.*, vol. 16(4), Jul./Aug. 1979, pp. 994–1003.

*Primary Examiner*—James R. Hoffman

[57] ABSTRACT

Forming a film by spraying onto a heated substrate an atomized solution containing the appropriate salt of a constituent element of the film and a reducing agent at a concentration greater than 1 M and greater than 10 times the stoichiometric amount of reducing agent.

7 Claims, 3 Drawing Figures

METHOD TO SYNTHESIZE AND PRODUCE THIN FILMS BY SPRAY PYROLYSIS

The Government has rights in this invention pursuant to Contract No. XS-9-8014-3 awarded by the U.S. Department of Energy.

BACKGROUND OF THE INVENTION

The invention relates to spray pyrolysis, which involves forming a film by spraying onto a heated substrate an atomized solution containing the appropriate salts of the constituent elements of the film compound. The chemical reaction occurs upon spraying on the heated substrate, and the nonconstituent elements of the salts are removed by volatilization along with the solvent, typically water. For example, U.S. Pat. No. 3,148,084 discloses, along with other examples, the formation of CdS by spray pyrolysis, according to the following equation:

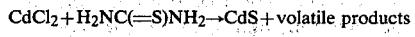

$$CdCl_2 + H_2NC(=S)NH_2 \rightarrow CdS + \text{volatile products}$$

Before the conception of this invention Messrs. Steven A. Lis, Harvey B. Serreze, and Peter M. Sienkiewicz proposed the process claimed in a copending patent application (Ser. No. 231,127 filed Feb. 3, 1981) involving placing an agent directly in a spray solution to cause a variety of desirable oxidation/reduction reactions to occur when the spray solution contacted the heated substrate. Subsequently, but also before the conception of this invention, Michael R. Squillante suggested that highly soluble-organic acids would be desirable reducing agents, and improvements in the purity of the film compound were noted (Ser. No. 231,128 filed Feb. 3, 1981).

SUMMARY OF THE INVENTION

In the course of efforts to further increase purity, I discovered that using an unusually high concentration of reducing agent (i.e., greater than 1 M) and much greater than a stoichiometric amount of reducing agent (i.e., greater than 10 times and preferably greater than 900 times the stoichiometric amount), unexpectedly resulted in the formation of a high purity film.

In preferred embodiments a constituent element of the film is reduced after contacting the heated substrate; the constituent element is Te and the film is CdTe; the salts used in the spray solutions are $(NH_4)_2TeO_4$ and $Cd(OH)_2$; a copper dopant ("dopant" is used herein in the sense defined at p. 372 of Kittel, *Introduction to Solid State Physics*, 4th ed., John Wiley & Son) material is also placed in the spray solution, and it changes in oxidation state after contacting the heated substrate; and impurities are reduced to a volatile form after contacting the heated substrate.

PREFERRED EMBODIMENTS

The preferred embodiments of the invention will now be described.

STRUCTURE AND APPARATUS

Figure 1:
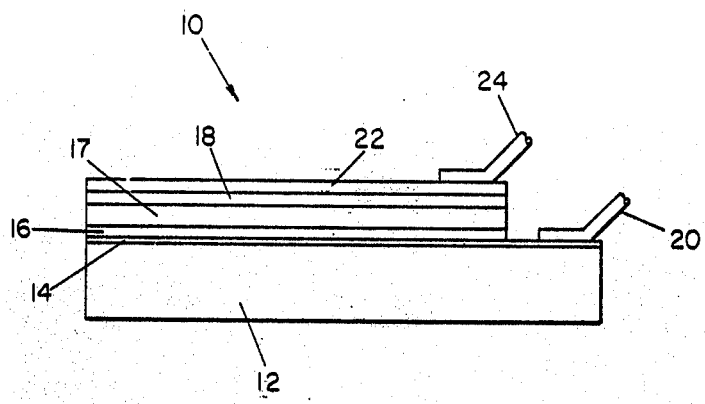
FIG. 1 is an elevation of a photovoltaic device made according to the invention.

Referring to the embodiment of FIG. 1, there is shown photovoltaic device 10 comprising glass substrate 12, layer of indium tin oxide 14 (approximately 1000 Angstroms thick) thereon, layer 16 of sprayed cadmium zinc sulfide (1000 to 2000 Angstroms thick) thereon, layer 17 of sprayed cadmium telluride (2500 to 5000 Angstroms thick) thereon, layer 18 of Aquadag (a dried graphite-in-water suspension) thereon, wire 20 attached to indium tin oxide layer 14 and wire 24 connected to the Aquadag by silver paint patch 22.

Figure 2:
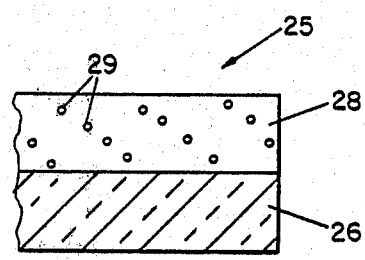
FIG. 2 is a diagrammatic fragmentary vertical sectional view of a solar heat absorbing panel made according to the invention.

In the embodiment of FIG. 2 there is shown solar heat absorbing panel 25 comprising glass substrate 26 and layer 28 (1000–2000 Angstroms thick) of $Al_2O_3$-Ag cermet thereon. Dots 29 represent regions of metallic silver dispersed throughout the $Al_2O_3$.

Figure 3:
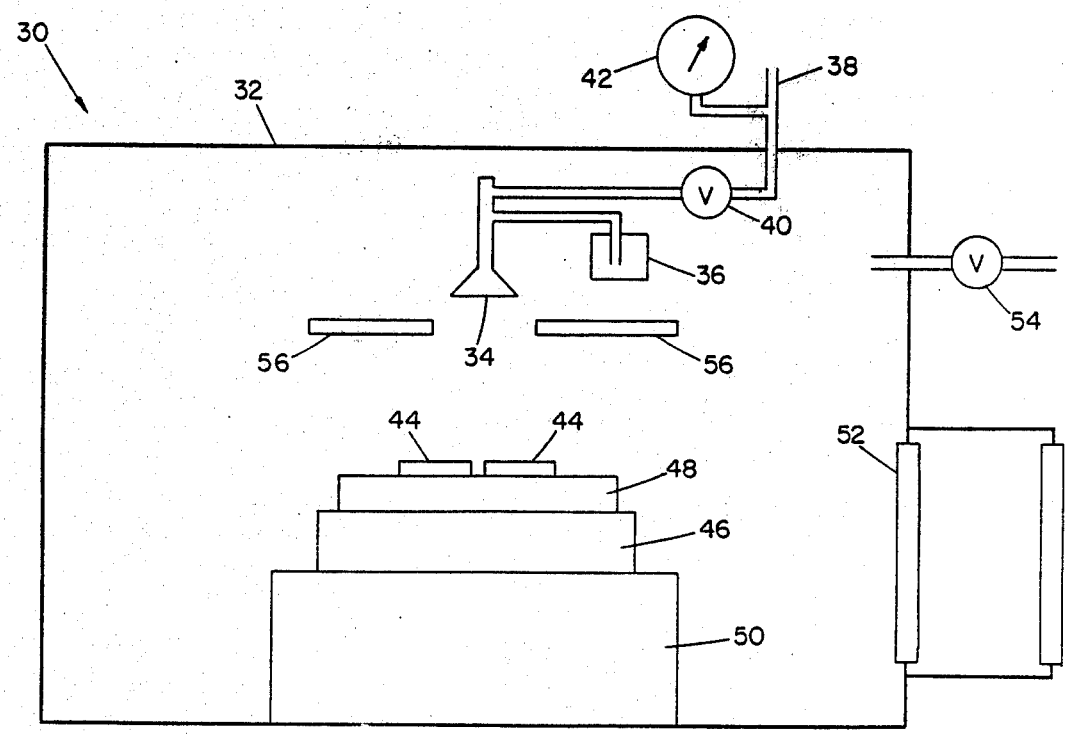
FIG. 3 is a diagrammatic representation of the spraying apparatus and heating means useful for making the devices of FIGS. 1 and 2 according to the invention.

Referring to FIG. 3, there is shown spraying and heating apparatus 30 having air-tight enclosure 32. Spray nozzle 34 ($\frac{1}{4}$ J with a 1050 SS fluid cap available from Spraying Systems Company) is supplied by solution bottle 36 and source of nitrogen spray gas 38. The gas flow is regulated by valve 40, and the pressure is monitored from gauge 42. Substrates 44 (e.g., substrate 12 and layer 14 or substrate 26) are heated by heater 46 through tin bath 48. Nozzle 34 is located 12″ above substrates 44. External means controls the temperature of heater 46, and the heater is mounted within enclosure 32 on insulating block 50. Access to the heater is provided by pass-through 52 (shown diagrammatically), and valve 54 regulates supply of nitrogen purge gas through the interior of box 32. Heat shields 56 are used to shield the solution and nozzle control apparatus 34, 36, 40 from high temperatures and the vapors from the heating apparatus below it.

Manufacture

In making the photovoltaic device of FIG. 1, films 16 and 17 are sprayed onto indium tin oxide coated glass (substrate 12 and layer 14 of the FIG. 1 device, available from Pittsburg Plate Glass Inc.) using the FIG. 3 apparatus. First spray solution I for layer 16 and spray solution II for layer 17 are prepared by making aqueous solutions including the ingredients set forth in the following table at the indicated concentrations.

TABLE 1

| Ingredient | Concentration in Solution (M) |
|---|---|
| Solution I | |
| $CdCl_2 \cdot 2.5 H_2O$ | 0.0167 |
| $ZnCl_2$ | 0.0083 |
| Thiourea | 0.025 |
| $In(OH)_3$ | 0.00025 |
| Formic Acid | 9.62 |
| Solution II | |
| $Cd(OH)_2$ | 0.021 |
| $(NH_4)_2TeO_4$ | 0.085 |
| $Cu^{++}$ | 0.00064 |
| Formic Acid | 9.62 |

The cadmium hydroxide is prepared by dissolving 20 gm of reagent grade $Cd(NO_3)_2$ in 100 ml distilled $H_2O$ and titrating this with a saturated NaOH solution to complete precipitation of $Cd(OH)_2$. The precipitate is filtered, washed several times with H₂O and dried at 80° C. for 16 hours.

The copper stock solution is prepared by etching copper shot (99% pure, available from Fisher Scientific Co), dissolving it in a slight excess of concentrated nitric acid, and diluting it to 0.05 M.

All chemicals are reagent grade and obtained from Fisher Scientific Company, except for $In(OH)_3$, which is ultra pure and obtained from the Alpha Division of Ventron Corp., Danvers, Mass., and the $(NH_4)_2TeO_4$, which is obtained in powdered form from Ventron.

In spite of the fact that a large amount of reducing agent is used, the Te in Solution II remains in the $+6$ oxidation state, allowing a higher concentration of Te than would be possible if Te were in the highly insoluble $-2$ state.

The spray chamber within box 32 is purged using nitrogen gas. The volume of the chamber is displaced three times with the nitrogen, and then the chamber is flushed continuously for five minutes more. The indium tin oxide coated glass substrates are cleaned by vapor degreasing with reagent grade trichloroethylene, and placed on the heated molten tin bath 48 and brought to a temperature between 325° and 550° C., (preferably between 370° and 425° C., and most preferably of 400° C.). Thirty-five ml of solution I is sprayed onto the heated substrates with nozzle 34, the spray gas flowing at 2.0 ml/min at a pressure of 10 to 12 psi, the liquid being pumped from bottle 30 by siphoning. The spray is discontinued by stopping the fluid flow from container 36. This results in the formation of layer 16 of ZnCdS on top of layer 14, the following reaction occurring on the heated substrate:

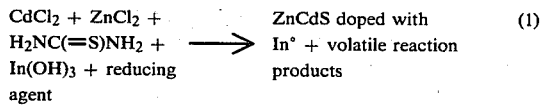

$$CdCl_2 + ZnCl_2 + H_2NC(=S)NH_2 + In(OH)_3 + \text{reducing agent} \longrightarrow \text{ZnCdS doped with } In° + \text{volatile reaction products} \quad (1)$$

The indium is apparently reduced from the $+3$ state to metallic indium upon spraying on the substrate, and this metallic dopant makes the layer more conductive without the necessity of a post-deposition annealing step.

Immediately following the spraying of solution I, 200 ml of solution II is sprayed onto substrates 44 under the same spray and temperature conditions, the following reaction occurring on the heated substrate:

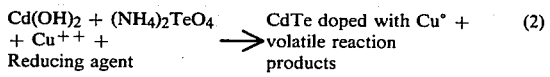

$$Cd(OH)_2 + (NH_4)_2TeO_4 + Cu^{++} + \text{Reducing agent} \longrightarrow \text{CdTe doped with } Cu° + \text{volatile reaction products} \quad (2)$$

The tellurium is reduced to the $-2$ state, allowing it to combine with the cadmium. The $Cu^{++}$ is apparently reduced to metallic copper, thereby making the layer more conductive. Again, a post-deposition annealing step is not required.

The presence of the reducing agent in high concentration in both solutions I and II also induces removal of impurities by converting them to volatile reaction products, and nitrogen, an inert element, is used as both the spray and ambient gas to avoid the extraneous introduction of impurities from the atmosphere.

The substrates are removed from the heater within three minutes after spraying of solution II. The substrates are cooled in the purged atmosphere for five minutes, and then removed from the chamber through pass-through 52.

The Aquadag-E suspension (25% graphite in water; available from Acheson Colloids Company) is applied to the upper surface of the sprayed substrates with a wood applicator and dried at room temperature. Silver paint 25 is applied to the surface of the Aquadag-E layer 18, and copper wire lead 24 is attached to the paint 25 for external electrical connection. The silver paint should be dried for several hours at room temperature. A second copper lead 20 is connected directly to the indium tin oxide 12 using indium solder after scraping off some of layers 16 and 17.

The cadmium concentration in the solution II is greater than that necessary to react with the tellurium because cadmium has been found to be more volatile than the tellurium during spraying onto the heated substrate.

Formic acid is a particularly useful reducing agent, as it is highly soluble in aqueous solutions, and this allows increasing the concentration of the reducing agent to the high concentrations that have been found necessary to obtain the desired, virtually complete oxidation/reduction reactions occurring on the heated substrate surface. Acetic acid is a highly preferred alternative. In general, it is preferred that the reducing agent be a highly-water-soluble organic acid.

The formic acid concentration should be greater than 1 M and also greater than ten times the stoichiometric amount to cause the desired oxidation/reduction reactions to occur upon contacting the heated substrate.

The $Al_2O_3$-Ag cermet of FIG. 2 is made by the same procedure as the FIG. 1 device by spraying solution III (Table 2) onto glass substrate 26, using the same spray, temperature, and nozzle conditions described above.

TABLE 2

| Solution III | |
|---|---|
| Ingredients | Concentration in Solution (M) |
| $Al(NO_3)_3 \cdot 9H_2O$ | 0.003 |
| $AgNO_3$ | 0.0015 |
| Formic acid | 9.62 |

Once again the chemicals are all reagent grade and are available from Fisher Scientific Company.

Examples of other solutions which can be sprayed with the FIG. 3 apparatus are presented in the following table:

TABLE 3

| Solution | Ingredients | Concentration in Solution (M) |
|---|---|---|
| IV | $Bi(C_2H_3O_2)_3$ | 0.01 |
| | $(NH_4)_2TeO_4$ | 0.0150 |
| | Formic acid | 9.62 |
| V | $Zn(N_3)_2$ | 0.21 |
| | $(NH_4)_2TeO_4$ | 0.21 |
| | Formic acid | 9.62 |
| VI | $AgNO_3$ | 0.1 |
| | Formic acid | 9.62 |
| VIII | $Cr(NO_3)_3$ | 0.1 |
| | Formic acid | 9.62 |

The reactions appear to be as follows:

$$2Bi(C_2H_3O_2)_3 + 3(NH_4)_2TeO_4 + \text{reducing agent} \longrightarrow Bi_2Te_3 + \text{volatile reaction products} \quad (4)$$

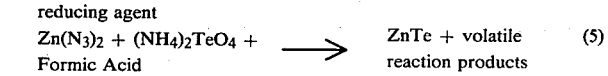

$$Zn(N_3)_2 + (NH_4)_2TeO_4 + \text{Formic Acid} \longrightarrow ZnTe + \text{volatile reaction products} \quad (5)$$

TABLE 3-continued

| Solution | Ingredients | | Concentration in Solution (M) | |
|---|---|---|---|---|
| $AgNO_3$ + Formic acid | → | $Ag°$ + volatile reaction products | (6) |
| $Cr(NO_3)_3$ + Formic acid | → | $Cr°$ + volatile reaction products | (7) |

A constituent element may itself be used as a source of dopant by using an excess of the material in the spray. For example, the Cd portion of CdTe can be increased as is described in the following equation:

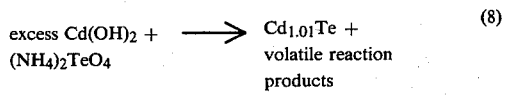

$$\text{excess } Cd(OH)_2 + (NH_4)_2TeO_4 \longrightarrow Cd_{1.01}Te + \text{volatile reaction products} \quad (8)$$

In the above reaction, in order to maintain an excess of Cd in the film, a much larger excess of Cd salt must be used in the spray solution.

In all of the above examples, the presence of a reducing agent in a high concentration also serves to convert impurities to a volatile form.

Other Embodiments

Other embodiments are within the following claims. For example the principles outlined above will find application in using an oxidizing agent when it is desired to have a film element in a higher oxidation state in the film than in the starting material. Also, other dopants will work. The solvent need not be water; methanol is a preferred alternative.

Finally, the principles outlined above will apply to making a large number of other films, e.g., $Hg_xCd_{1-x}Te$, $Zn_xCd_{1-x}S$, CdS, CdSe, ZnS, ZnSe, GaAs, $Ga_xAl_{1-x}As$, InP, BN, Ni-Co-Cr alloys, $Zn_3P_2$, and $ZnSnP_2$.

I claim:

1. In the process of making a thin film comprising preparing a solution with solute elements including a salt of a first constituent element of said film and spraying said solution onto a heated substrate to form a film on said substrate, the solute and solvent elements not constituting said film forming volatile reaction products after contacting said heated substrate, said solution also including a reducing agent in sufficient amount to change the oxidation state of at least one said solute element after contacting said heated substrate, the improvement wherein the concentration of said reducing agent is greater than 1 M and greater than 10 times the stoichiometric amount necessary to react with said one solute element.

2. The improvement of claim 1 wherein the concentration of said reducing agent is greater than 900 times the stoichiometric amount.

3. The improvement of claim 1 wherein said one solute element is a constituent element of said film.

4. The improvement of claim 3 wherein said one solute element is said first constituent element and is tellurium, said solute elements further comprising a soluble inorganic compound of a second constituent element, said second constituent element being cadmium.

5. The improvement of claim 4 wherein said salt of said first constituent element is $(NH_4)_2TeO_4$ and said soluble inorganic compound of said second constituent element is $Cd(OH)_2$.

6. The improvement of claim 4 or 5 wherein another said solute element is a dopant, said dopant changing in oxidation state after contacting said heated substrate.

7. The improvement of claim 1 wherein said one solute element is an impurity that converts to a volatile form with said change in oxidation state.

* * * * *